Oct. 28, 1958

D. R. KERN 2,858,437

OSCILLATION GENERATOR

Filed Nov. 17, 1955

INVENTOR
DALE ROY KERN
BY
Norman J. O'Malley
ATTORNEY

Patented Oct. 28, 1958

2,858,437

OSCILLATION GENERATOR

Dale Roy Kern, Saxonville, Mass., assignor to Sylvania Electric Products Inc., a corporation of Massachusetts Application November 17, 1955, Serial No. 547,377

4 Claims. (Cl. 250—36)

Figures 1, 2:
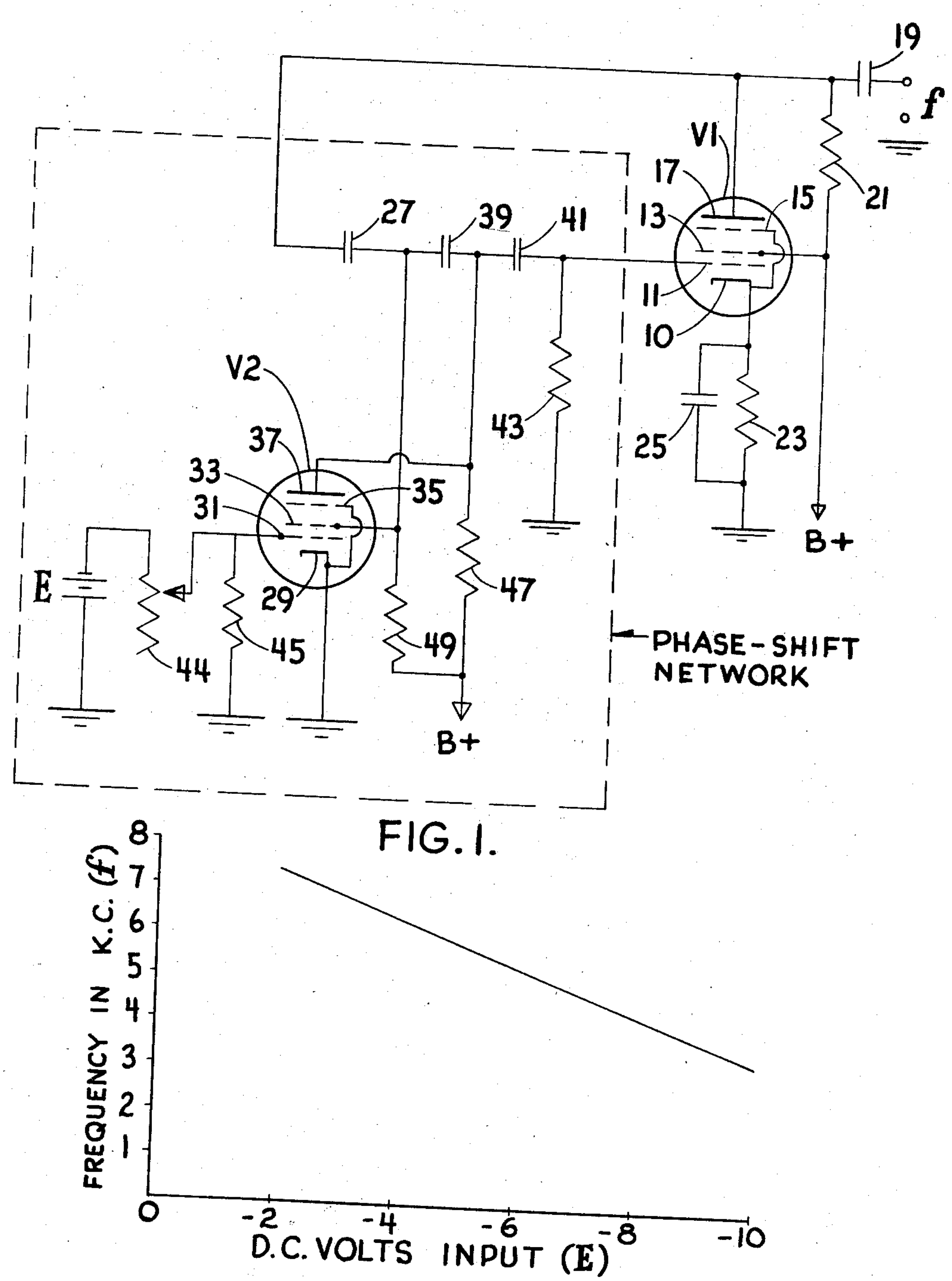

This invention relates to oscillation generators and more particularly to a signal controlled variable frequency phase-shift oscillation generator.

Several types of oscillation generators have been developed to produce audio frequency oscillations. Most of these oscillators use inductance-capacitance tuned circuits, which operate quite satisfactorily over the medium and high audio frequency ranges. However, at low audio frequencies, such circuits become impractical due to component limitations. The difficulty of obtaining low frequency oscillations may be overcome by heterodyning two high frequency oscillators to produce the desired low frequency of oscillation. However, the frequency stability is poor in this type circuit at low frequencies, since a small change in one oscillator frequency produces a high percentage change in the heterodyne frequency.

Resistance-capacitance tuned oscillators employing feed-back circuits have been developed to successfully produce low audio frequency oscillations. Generally these circuits have a three section resistance-capacitance network in the feed-back loop interconnecting the anode and cathode of the oscillator tube. Each section of the network provides a 60° phase-shift in the feed-back signal, thereby providing for a 180° phase-shift over the entire network. This shift in phase, coupled with the 180° phase-shift in the oscillator tube between the grid and anode produces an in-phase feedback signal. Proper selection of values for the network parameters will result in stable operation of the oscillator generator at the low audio frequency desired.

If the resistance or the capacitance components of an R-C phase-shift network are varied, the audio frequency output of the oscillator will vary accordingly. However, to change the value of these components it is usually necessary to construct ganged resistance or reactive units and employ calibrating devices such as tuning dials and decade switches to assure proper selection of the output frequency over the frequency range desired. These units and switches are bulky and expensive to construct. In addition, it is very often desirable to vary either the resistance or capacitance components of the R-C phase-shift network by a direct current control voltage. The equipment needed for facilitating a direct current control generally comprises a motor, a control circuit and appropriate stops and linkages. Here again such a system is bulky and expensive to construct.

It is therefore an object of this invention to reduce the aforementioned disadvantages and to provide a low frequency oscillation generator which is compact and economical to construct.

A further object is to provide a variable low frequency generator wherein the variation in frequency is controlled by an electron tube.

A still further object is the provision of a variable frequency oscillator generator employing a frequency control tube enabling a change of frequency of the oscillator to be a linear function of the input voltage to the control tube.

A still further object is the provision of an oscillation generator which utilizes the dynamic resistances of an electron tube to determine the frequency of oscillation.

The aforementioned objects, in addition to further objects which will be apparent after reading the following description, are achieved in one aspect of the invention by the provision of a variable frequency oscillator generator which employs an electron tube whose electrical characteristics control the frequency of the oscillations.

For a better understanding of the invention, reference is made to the following description taken in conjunction with the accompanying drawings in which:

Fig. 1 is a schematic drawing of a circuit embodying one aspect of the invention; and Fig. 2 is a graphical illustration showing the relationship between two of the dependent electrical characteristics of the circuit.

Referring to Fig. 1, the variable frequency phase-shift oscillator circuit comprises an oscillator tube $V_1$ and a phase-shifting network interconnecting the anode and grid of $V_1$. For self-sustained oscillations, the voltage introduced from the output or anode of $V_1$ to its input or control grid must be in phase with the input voltage, and the overall amplification of the network must be equal to or greater than unity. The circuit illustrated in Fig. 1 has a three section R-C network, with the dynamic resistances of tube $V_2$ serving as two of the resistance components for two of the sections. Each section provides a 60° phase-shift with a resultant of 180° phase-shift over the entire R-C network. Tube $V_1$ also provides a 180° phase-shift between the control grid input signal and the anode voltage. The summation of the phase-shifting components thereby total 360°, which condition satisfies the phase-shift requirements for self-sustaining oscillations. The second requirement for producing self-sustained oscillations depends on the selection of circuit parameters, since the amplification factor of $V_1$ times the fraction of the output of $V_1$ applied to its control grid must be equal to or greater than unity.

The operating frequency of an R-C tuned phase-shift oscillator may be mathematically defined by the equation $$f=\frac{1}{KRC}$$

where K is a constant determined by the circuit parameters. The equation reflects the inversly proportional relationships between the impedances and the dependent frequency $f$. Therefore, if the value of resistance in the phase-shift network is increased, the frequency of oscillation will decrease, and vice versa.

The anode to cathode dynamic resistance and the screen grid to cathode dynamic resistance of the pentode $V_2$ is utilized to provide two of the resistance components in the R-C network. These dynamic resistances may be varied by changing the direct current bias E on the control grid of $V_2$ in a manner well known in the art. Since the anode current and screen grid current increase as the control grid bias becomes more positive or less negative, the dynamic anode and screen grid resistances vary in accordance with the relationship $$\frac{dEp}{dIp}$$

where $d$ is the differential change in value for a given change in grid bias. Hence, as the anode and screen grid currents increase over the operating range of $V_2$, the dynamic resistances of the anode and screen grid relative to the cathode decrease. Referring to the graph in Fig. 2, the relationship between the control grid voltage of $V_2$ and the output frequency $f$ of the circuit is shown as being of a linear nature. A decrease in negative bias on $V_2$ decreases the dynamic resistances of the anode and screen grid of this tube to effectively increase the output frequency of the oscillator in accordance with $$f=\frac{1}{KRC}$$

Therefore, by varying the bias on $V_2$, the output frequency of the circuit can be changed.

Pentode amplifier $V_1$ having a cathode 10, control grid 11, screen grid 13, suppressor grid 15, and an anode 17 is coupled to the output terminals of the circuit by a blocking capacitance 19. A dropping resistance 21 connects anode 17 to the B+power supply. Screen grid 13 is preferably coupled directly to B+. Although a pentode has been illustrated in Fig. 1, with suppressor grid 15 operating at cathode potential, a tetrode or triode will also perform satisfactorily. Cathode 10 is maintained at a potential above control grid 11 by means of the series resistance 23, while a low reactance capacitance 25 in the cathode circuit serves to by-pass the alternating current to ground.

The phase-shift network interconnects anode 17 and control grid 11 of $V_1$. This network comprises three R-C meshes with a common ground connection for the resistance components. The first phase-shift network mesh comprises capacitance 27 and the dynamic resistance between cathode 29 and screen grid 33 of $V_2$. The second mesh includes capacitance 39 and the dynamic resistance between cathode 29 and anode 37 of $V_2$, while the third mesh consists of capacitance 41 and resistance 43.

Control grid 31 of $V_2$ is negatively biased relative to cathode 29 by the direct current supply E, variable resistance 44 and grid bias resistance 45. The B+ supply for $V_2$ is connected to anode 37 and screen grid 33 through dropping resistances 47 and 49 respectively. Although $V_2$ is illustrated as a pentode, with suppressor grid 35 coupled to cathode 29, a tetrode will also function satisfactorily.

Referring to Fig. 2, the frequency in kilocycles at the output of $V_1$ increases linearly with a decrease in the negative bias on grid 31 of $V_1$. Since a decrease in the negative voltage across resistance 45 increases the anode current of $V_2$, the dynamic resistances between cathode 29 and the screen grid 33 and anode 37 providing the resistances for two of the phase-shift meshes correspondingly decrease. In accordance with the relationship $$f=\frac{1}{KRC}$$

the output frequency $f$ therefore increases.

To produce the output frequency characteristics illustrated by the graph in Fig. 2, capacitances 27, 39 and 41 have values of 100 micro-micro farads while the screen grid dropping resistor 49 is .91 megohm and dropping resistor 47 is 1 megohm with an anode D. C. supply of 150 volts. Resistance 43 has a value of .1 megohm. The grid bias resistance 45 is .24 megohm while resistance 43 is .1 megohm and anode dropping resistance 21 has a value of 24 kilohms.

Although a three mesh phase-shift circuit has been illustrated, an R-C phase-shift loop with other than three meshes may be employed, and the values of the capacitances need not be identical so long as the value of the parameters determined according to the dynamic resistances of the amplifier tube employed satisfies the equation $$f=\frac{1}{KRC}$$

A satisfactory variable frequency phase-shift oscillator utilizing one aspect of the invention may also employ an RL network having a multiplicity of meshes. In this instance, the selection of $V_2$ and the circuit parameters must satisfy the conditions $$f=\frac{KR}{L}$$

Unlike the R-C network, a variation in inter-electrode dynamic resistances of an amplifier employed in an RL phase-shift oscillator produces a directly proportional variation in the output frequency.

If desired, a tube having a sufficient number of grid electrodes with proper grid to cathode potentials applied to them could provide the three dynamic resistances needed for a three mesh phase-shift network. For instance, if grid 35 of $V_2$ was connected to B through a dropping resistance, the dynamic resistance between grid 35 and cathode 29 could be used to replace resistance 43 in the third phase-shifting mesh. An auxiliary tube could also provide the dynamic resistance to replace resistance 43 if desired.

While there has been shown and described what at present is considered to be the preferred embodiment of the invention, it will be understood by persons skilled in the art that modifications may be made therein without departing from the scope of the invention as described in the accompanying claims.

What is claimed is:

1. A variable frequency oscillator comprising, in combination, a first amplifier tube having at least anode, cathode and control grid electrodes, a resistor-capacitor delay network for reversing the phase of the feedback voltage connected between the anode and control grid of said first amplifier tube, said network consisting of a plurality of series capacitors and a plurality of shunt resistors, and a variable resistance circuit included in said network for varying the frequency of the oscillator output, said variable resistance circuit comprising a second electron tube having an anode, a cathode, a control grid and at least one additional grid, means for connecting the anode-to-cathode impedance and the impedance of said additional grid-to-cathode of said second tube into said delay network to function as at least a portion of two of said shunt resistors in said network, and means coupled to the control grid of said second tube for varying the anode-cathode and additional grid-cathode impedances of said second tube in accordance with a control signal.

2. In combination, an oscillator of the type including a resistor-capacitor delay network for reversing the phase of the feedback voltage, said network comprising a plurality of sections each consisting of a series capacitor and a shunt resistor, one of said shunt resistors being of fixed value and the others of said shunt resistors each consisting of a variable resistance network comprising an electron tube having at least an anode, a screen grid, a control and a cathode, means for connecting the anode-cathode impedance of said tube to the junction between a first two of said series capacitors, means for connecting the screen grid-cathode impedance of said tube to the junction between another two of said series capacitors, and means coupled to the control grid of said tube for varying the aforesaid impedances in accordance with a control signal.

3. In combination, an oscillator of the type including a resistor-capacitor delay network for reversing the phase of the feedback voltage, said network having three sections each consisting of a series capacitor and a shunt resistor, and a variable-resistance circuit included in said network comprising an electron tube having at least an anode, a cathode, a control grid and a screen grid, means for connecting the anode-cathode and screen grid-cathode impedances of said tubes into said delay network to function as at least a portion of the shunt resistors in two of said sections, and means including a variable direct current source coupled to the control grid of said tube for varying the aforesaid impedances to cause a change in the frequency of oscillation.

4. An oscillator of the type including a resistor-capacitor delay network for reversing the phase of the feedback voltage, said network having three sections each consisting of a series capacitor and a shunt resistor, one of which is of fixed value, and a variable resistance circuit included in said network comprising an electron tube having at least an anode, a cathode, a control grid and a screen grid, means for connecting the anode-cathode impedance of said tube into said delay network to function as at least a portion of one shunt resistor in said network, means for connecting the screen grid-cathode impedance of said tube into said delay network to function as at least a portion of another of the shunt resistors in said network, and means including a variable direct current source coupled to the control grid of said tube for varying the aforesaid impedances of said tube to cause a change in the frequency of oscillation.

References Cited in the file of this patent

UNITED STATES PATENTS

| | | |
|---|---|---|
| 2,321,269 | Artzt | June 8, 1943 |
| 2,498,759 | Korman | Feb. 28, 1950 |